United States Patent
Britton et al.

(10) Patent No.: US 10,819,318 B1
(45) Date of Patent: Oct. 27, 2020

(54) SINGLE EVENT UPSET IMMUNE FLIP-FLOP UTILIZING A SMALL-AREA HIGHLY RESISTIVE ELEMENT

(71) Applicant: Microchip Technology Inc., Chandler, AZ (US)

(72) Inventors: Barry Britton, Slatington, PA (US); Phillip Johnson, Hellertown, PA (US); John Schadt, Bethlehem, PA (US); David Onimus, Drexel Hill, PA (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/595,096

(22) Filed: Oct. 7, 2019

Related U.S. Application Data

(60) Provisional application No. 62/904,100, filed on Sep. 23, 2019.

(51) Int. Cl.
| | |
|---|---|
| *H03K 3/356* | (2006.01) |
| *H03K 3/037* | (2006.01) |
| *G11C 11/4078* | (2006.01) |
| *H03K 19/003* | (2006.01) |
| *G06F 1/14* | (2006.01) |
| *H03K 5/133* | (2014.01) |

(52) U.S. Cl.
CPC ............ *H03K 3/0372* (2013.01); *G06F 1/14* (2013.01); *G11C 11/4078* (2013.01); *H03K 3/0375* (2013.01); *H03K 5/133* (2013.01); *H03K 19/003* (2013.01)

(58) Field of Classification Search
CPC ............ H03K 3/35625; H03K 3/3562; H03K 3/356121; H03K 3/037; H03K 3/0372; H03K 3/0375; H03K 3/012; H03K 5/133; H03K 19/003; G06F 1/14; G11C 11/4078
See application file for complete search history.

(56) References Cited

U.S. PATENT DOCUMENTS 8,207,753 B2 * 6/2012 Cabanas-Holmen ........................
G11C 5/005
326/13
9,291,674 B1 3/2016 Lu et al.
(Continued)

OTHER PUBLICATIONS

International Search Report and Written Opinion, PCT/US19/61469, dated May 25, 2020.
(Continued)

*Primary Examiner* — Long Nguyen
(74) *Attorney, Agent, or Firm* — Glass and Associates; Kenneth Glass; Kenneth D'Alessandro

(57) ABSTRACT

An SEU immune flip-flop includes a master stage data latch having an input, an output, a clock input, being transparent in response to a clock signal first state and being latched in response to a clock signal second state, a slave stage data latch having an input coupled to the master stage data latch output, an output, a scan output, a slave latch clock input, a scan slave latch having an input coupled to the slave stage data latch scan output, an output, and a clock input, being transparent in response to the clock signal second state and being latched in response to the clock signal first state. The slave stage data latch includes a switched inverter disabled when the slave latch is in a transparent state and enabled when the slave latch is in a latched state having a time delay longer than an SEU time period.

14 Claims, 2 Drawing Sheets

(56) References Cited

U.S. PATENT DOCUMENTS

| | | |
|---|---|---|
| 2004/0017237 A1 | 1/2004 | Wood |
| 2007/0262787 A1* | 11/2007 | Chakraborty ........ H03K 3/0375 326/16 |
| 2009/0219752 A1* | 9/2009 | Wissel ................ G11C 11/4125 365/154 |
| 2019/0228825 A1 | 7/2019 | Hecht et al. |
| 2019/0237139 A1 | 8/2019 | McCollum et al. |

OTHER PUBLICATIONS

Zhang Man et al, "An Adaptive Single Event Upset (SEU)-Hardened Flip-Flop Design", 2019 IEEE International Conference on Electron Devices and Solid-State Circuits ( EDSSC), IEEE, Jun. 12, 2019, pp. 1-3.

* cited by examiner

SINGLE EVENT UPSET IMMUNE FLIP-FLOP UTILIZING A SMALL-AREA HIGHLY RESISTIVE ELEMENT

FIELD OF THE INVENTION

The present invention relates to digital logic elements. More particularly, the present invention relates to a Single Event Upset (SEU) immune flip-flop utilizing a dense, highly resistive construct, such as a resistive random-access memory (ReRAM) structure as a resistive element.

BACKGROUND

Flip-flops exposed to a Single Event Transient (SET) pulse can easily switch state. A flip-flop that switches its state causes the system employing it to become unstable, requiring the system to be reset (once it is recognized that the system is unstable). Resetting the system causes loss of information from the system.

An SEU immune flip-flop allows the system to continue running after a SET pulse. The system recovers and returns to normal operation. This is extremely important for mission critical applications.

One method of creating a SEU immune flip-flop is to use series resistor-capacitor (RC) networks to filter out the SET event. The filter action must keep the amplitude of the SET pulse to less than the flip-flop switch point (or the switch point of an inverter inside the flop).

One issue that arises in the use of this prior art method is the physical size of the RC network. A 5μ×5μ capacitor may provide 100 fF of capacitance, but is quite large, having an area of $25\mu^2$. In addition, the normal sheet resistance, $\rho$, of a resistor is approximately between 600 ohms and 10 Kohms. In order to provide approximately 1 ns of SEU/SET immunity at least 100K ohm of resistance is needed. Accordingly, a minimum of 10 squares is needed, which is a large area. Given these areas, the flip-flop becomes too large to implement using such a network.

A second method that has been used to provide circuits with SEU/SET immunity has been to provide three copies of the circuitry and use a voting circuit to determine the correct output. This solution consumes over three times the die area of one of the individual circuits.

BRIEF DESCRIPTION

According to an aspect of the invention, a single event upset (SEU) immune flip-flop includes a clock line configured to supply a clock signal, a master stage data latch having a data input, a data output, and a clock input, the master stage data latch assuming a transparent state in response to a first state of the clock signal and a latched state in response to a second state of the clock signal, a slave stage data latch having a data input coupled to the data output of the master stage data latch, a data output, a scan output, and a slave latch clock input, a scan slave data latch having a data input coupled to the scan output of the slave data latch, a data output, and a clock input, the scan slave data latch assuming a transparent state in response to the second state of the clock signal and a latched state in response to the first state of the clock signal, and a slave latch clock line configured to supply a slave clock signal to the slave latch clock input of the slave stage data latch, the slave stage data latch having a transparent state in response to a first state of the slave clock signal and a latched state in response to a second state of the slave clock signal. The slave stage data latch includes, a switched inverter that is in a disabled state when the slave stage data latch is in the transparent state and in an enabled state when the slave stage data latch is in the latched state, the switched inverter formed from switch transistors and inverter transistors, and a time delay regenerative feedback circuit when it is in its latched state, the time delay regenerative feedback circuit providing a time delay longer than a time period of an SEU event.

According to an aspect of the invention, the SEU immune flip-flop further includes a set signal line, and the master stage data latch and the scan slave data latch each include a set input coupled to the set signal line.

According to an aspect of the invention, the SEU immune flip-flop further includes a reset signal line and the master stage data latch and the scan slave data latch each include a reset input coupled to the reset signal line.

According to an aspect of the invention, the SEU immune flip-flop further includes a multiplexer having a first data input coupled to a data signal line, a second data input coupled to a scan input signal line, a data output coupled to the data input of the first stage data latch, and a select input coupled to an input select signal.

According to an aspect of the invention, the slave stage data latch has a data output coupled to an output node of the switched inverter.

According to an aspect of the invention, the time delay is provided by an RC network including a vertical resistive element and a capacitive element including gate capacitances of the inverter transistors in the switched inverter, the vertical resistive element connected in series with the capacitive element.

According to an aspect of the invention, the vertical resistive element is formed as an unprogrammed antifuse.

According to an aspect of the invention, the vertical resistive element is formed as a virgin ReRAM device.

According to an aspect of the invention, the vertical resistive element is formed as a layer of a high-resistance metal compound.

According to an aspect of the invention, the high-resistance metal compound is one of silicon-rich $SiO_2$, tantalum-rich $Ta_2O_5$, titanium-rich $TiO_2$, aluminum-rich $Al_2O_3$, and silicon-rich SiN.

According to an aspect of the invention, the switched inverter includes an inverter input node, and an inverter output node, and the switched inverter switch transistors and inverter transistors include a p-channel inverter transistor connected in series with a p-channel switching transistor between a first voltage supply node and the inverter output node, a gate of the p-channel inverter transistor connected to the inverter input node, an n-channel inverter transistor connected in series with an n-channel switching transistor the inverter output node and a second voltage supply node, a gate of the n-channel inverter transistor connected to the inverter input node, and the time delay regenerative feedback circuit including a first inverter whose input is connected to the inverter output node and whose output is connected in series with a vertical resistive element to the inverter input node, the provided time delay being a function of a resistance of the vertical resistive element and a capacitor including the capacitances of the gates of the p-channel inverter transistor and the n-channel inverter transistor.

According to an aspect of the invention, the SEU immune flip-flop further includes a second inverter connected between an output of the first inverter and the scan output of the slave stage data latch.

According to an aspect of the invention, the SEU immune flip-flop further includes a third inverter connected between an output of the first inverter and an output node of the SEU immune flip-flop.

BRIEF DESCRIPTION OF THE DRAWING FIGURES

The invention will be explained in more detail in the following with reference to embodiments and to the drawing in which are shown:

DETAILED DESCRIPTION

Figure 1:
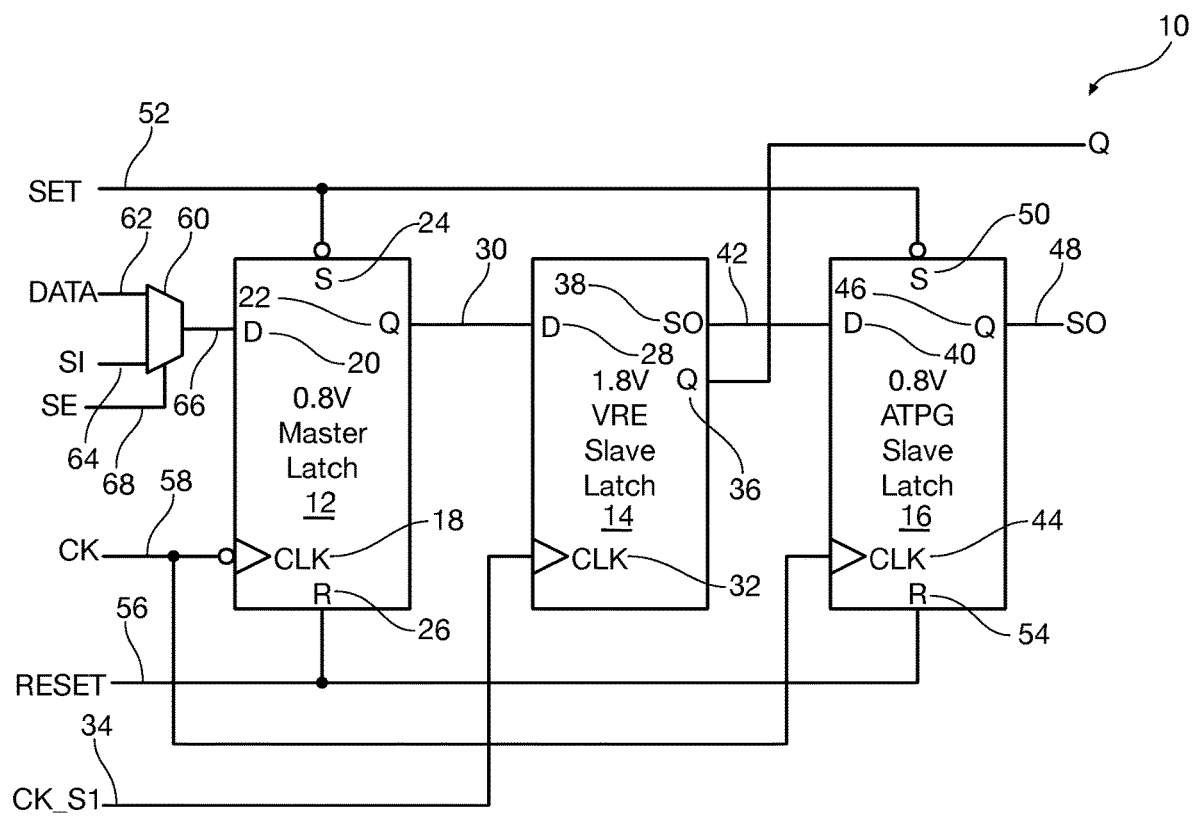
FIG. 1 is a block diagram of an illustrative SEU immune flip-flop in accordance with an aspect of the invention.

Persons of ordinary skill in the art will realize that the following description is illustrative only and not in any way limiting. Other embodiments will readily suggest themselves to such skilled persons.

Several highly resistive elements are known that may be formed as vertical structures that occupy small areas on an integrated circuit (i.e., they can occupy an area the size of an intermetal or metal-to-substrate contact). These structures will be referred to herein as vertical resistor elements. Examples of vertical resistor elements within the meaning of that term as used herein are unprogrammed antifuse elements, virgin ReRAM elements, i.e., unprogrammed ReRAM elements, and other high resistance structures. Each of these vertical resistor elements has an extremely high resistance while occupying a small area on an integrated circuit. Their extremely high resistance allows a small capacitance to be used for an RC network within an SEU immune flip-flop. The gate capacitance of a field effect transistor (FET) in the circuit may serve as the small capacitance "C" in the RC network. The designation "VRE" is used to designate these vertical resistor elements in the drawing figures.

Referring now to FIG. 1, a block diagram shows an illustrative SEU immune flip-flop 10 in accordance with an aspect of the invention. The SEU immune flip-flop 10 includes three stages, a master stage data latch 12, a slave stage data latch 14 which contains the vertical resistor element, and scan slave stage data latch 16 for the fast shifting of data through the SEU immune flip-flop 10 for use in a scan chain to provide for scan chain data entry and diagnostic testing such as automatic test pattern generator (ATPG) diagnostics.

The master stage data latch 12 is a level clocked latch as is known in the art, meaning that when the clock input 18 is at a first logic level the latch is transparent and data appearing at its data input (D) 20 is passed through to its data output (Q) 22. When the clock input 18 at a second logic level, opposing the first logic level, the data output Q 22 maintains the previous data appearing at data input D 20, i.e., changes in the data input D 20 are not passed to data output Q 22. In some embodiments of the invention, the data latch has a set input (S) 24 that forces the Q output 22 to a one, or high, logic state when active and a reset input (R) 26 that forces the Q output 22 to a zero, or low, logic state when active. Set and reset inputs to latches are well known and are universally used to set or reset the state of the latch as desired by the user. Set input (S) 24 is connected to SET line 52 which forces the Q output 22 to a one logic state when an active signal is asserted on SET line 52. Reset input (R) 26 is connected to RESET line 56 which forces the Q output 26 to a zero logic state when an active signal is asserted on RESET line 56. Persons of ordinary skill in the art will appreciate that the master stage data latch 12 may have one, both, or neither of the SET and RESET inputs 24 and 26.

The slave stage data latch 14 is also a level clocked data latch having a data input 28 connected to the Q output 22 of the master stage data latch 12 by line 30, a slave latch clock input CLK 32 connected to a slave latch clock line CK_S1 shown at reference numeral 34, a Q output 36 and a scan out (SO) output 38. The Q output 36 forms the output of the SEU immune flip-flop 10 and can be used, for example, to set the input of a multiplexer or to programmably connect two interconnect conductors in a user-programmable integrated circuit. Slave latch clock line CK_S1 is arranged to provide a slave clock signal. The slave stage data latch 14 is transparent responsive to a first state of the slave clock signal and is latched responsive to a second state of the slave clock signal.

The scan slave data latch 16 is also a level clocked latch having a data input D 40 connected to the SO output 38 of the slave stage data latch 14 by line 42, and a clock input 44, a Q output 46 connected to a SO output 48 for the SEU immune flip-flop 10. In some embodiments of the invention, the scan slave data latch 16 may have a set input (S) 50 that forces the Q output 46 to a one logic state when an active signal is asserted on SET line 52 and a reset input (R) 54 that forces the Q output 46 to a zero logic state when an active signal is asserted on RESET line 56. Persons of ordinary skill in the art will appreciate that the master stage data latch 12 may have one, both, or neither of the SET and RESET inputs 50 and 54.

The clock inputs 18 and 44 of the master stage data latch 12 and the scan slave data latch 16, respectively, are connected together to a clock line 58, denoted CK, which clock line 58 is arranged to provide a clock signal. The clock input 18 to the master stage data latch 12 is inverted, and therefore when the master stage data latch 12 is transparent responsive to a first state of the clock signal, the scan slave data latch 16 is latched and when the master stage data latch 12 is latched responsive to a second state of the clock signal, the scan slave data latch 16 is transparent.

A multiplexer 60 has a first data input connected to a data input line 62, denoted DATA, a second data input connected to a scan input line 64, denoted SI, a data output connected at line 66 to the data input D 20 of the master stage data latch 12. A select input of the multiplexer is connected to a select line SE 68. The scan input SI 64 serves as a scan input for the SEU immune flip-flop 10.

One advantageous use of the SEU immune flip flop 10 of the present invention is in an integrated circuit including a serially-connected chain of many such SEU immune flip flops 10 into and out of which a serial stream of data can be clocked using the SI and SO inputs/outputs for the purposes of loading the data into the flip-flops and reading data out of the flip flops for circuit diagnostics. Serial flip-flop chains using conventional flip-flops are already known and in use.

Figure 2:
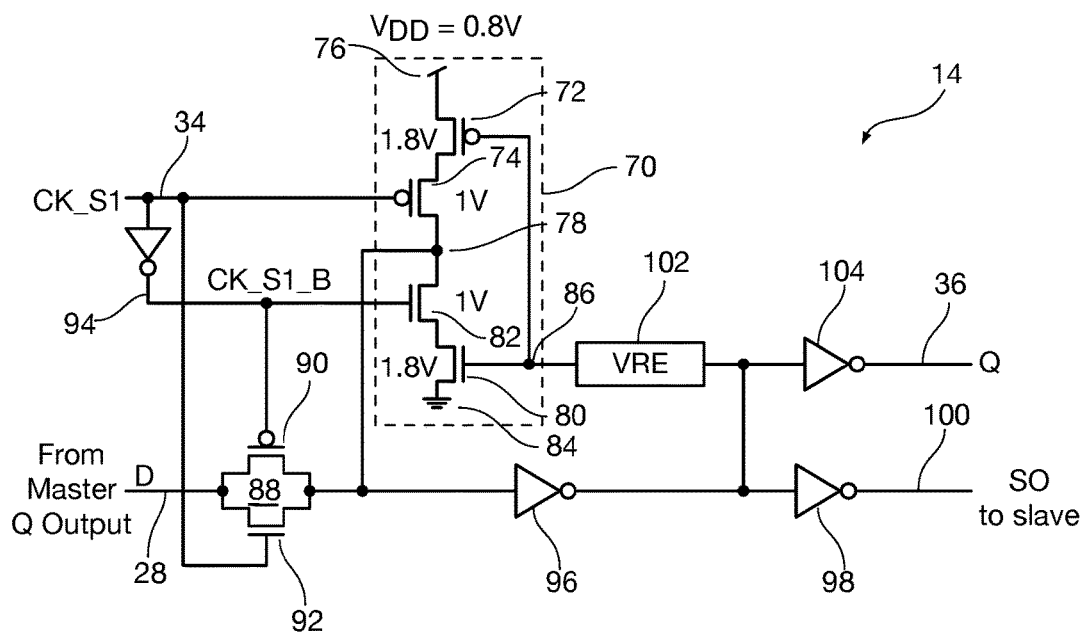
FIG. 2 is a schematic diagram of an illustrative slave latch that may be employed in the SEU immune flip-flop depicted in FIG. 1.

Referring now to FIG. 2, a schematic diagram shows an illustrative slave stage data latch 14 that may be employed in the SEU immune flip-flop depicted in FIG. 1. The slave stage data latch 14 includes a switched inverter shown within dashed lines 70 that includes a p-channel inverter transistor 72 connected in series with a p-channel switch transistor 74 between a first voltage supply potential shown as $V_{DD}$ at reference numeral 76 and an inverter output node 78. The switched inverter shown within dashed lines 70 also includes an n-channel inverter transistor 80 connected in series with an n-channel switch transistor 82 between a voltage supply potential shown as ground at reference numeral 84 and the inverter output node 78. The gates of the p-channel inverter transistor 72 and the n-channel inverter transistor 80 are connected together to form the input node 86 of the switched inverter 70. The switch transistors 74 and 82 are used to selectively enable and disable the switched inverter as is well understood in the art.

In accordance with an embodiment of the invention, in a process employing 1V core transistors, the p-channel switch transistor 74 and the n-channel switch transistor 82 may be fabricated as core transistors, but this size transistors may have unacceptably high gate leakage to be used as the p-channel inverter transistor 72 and the n-channel inverter transistor 80. In instances where core transistors have an unacceptably high gate leakage, special transistors having thicker gate oxide layers could be specified for use as the inverter transistors 72 and 80 but it is less costly to substitute high-voltage transistors (e.g., 1.8V transistors typically used as I/O transistors in an integrated circuit using 1V core transistors) having thicker gate oxide layers that are already used in the process for peripheral devices for use as the inverter transistors 72 and 80.

D input 28 is connected to the input of a passgate 88 including a p-channel passgate transistor 90 connected in parallel with an n-channel passgate transistor 92. The gate of the n-channel passgate transistor 92 is connected to the clock input 32 of the slave stage data latch 14, which as indicated above is connected to the CK_S1 clock line, and the gate of the p-channel passgate transistor 90 is connected to the complement of the CK_S1 clock line shown at reference numeral 94 and denoted CK_S1_B, generated from the CK_S1 clock line by an inverter. The gate of p-channel switch transistor 74 is connect to the CK_S1 clock line and the gate of n-channel switch transistor 82 is connected to the CK_S1_B line. The output of the passgate 88 is connected to the output node 78 of the switched inverter 70 and to a pair of series connected inverters 96 and 98. The output of inverter 96 is further connected to the input node 86 of the switched inverter 70 at the gates of the p-channel inverter transistor 72 and the n-channel inverter transistor 80, the connection being through a vertical resistor element 102. The output of the inverter 98 on line 100 is the SO output (reference numeral 38 shown in FIG. 1) of the slave stage data latch 14 that is connected to the D input 40 of the scan slave latch 16.

Vertical resistor element 102 is connected between the output of the inverter 96 and the gates of the p-channel inverter transistor 72 and the n-channel inverter transistor 80 forming the input node 86 of the switched inverter 70 to form a time delay regenerative feedback circuit as a loop around the switched inverter 70, whose time delay is determined by the RC network formed by the vertical resistor element 102 and combined gate capacitances of the inverter transistors 72 and 80. This time delay provides the SEU immunity of the SEU immune flip-flop 10 of the present invention when slave stage data latch 14 is in its latched mode. The output of inverter 96 is also connected to the input of an inverter 104. The output of the inverter 104 forms the Q output of the slave stage data latch 14 that drives the load of the entire SEU immune flip-flop 10, for example input states to multiplexers or other configurable circuits that define their functions or connect interconnect lines in the programmable circuit.

If the slave latch clock line CK_S1 34 is held at a high logic level, the slave stage data latch 14 is held in transparent mode because the p-channel transistor 90 and the re-channel transistor 92 of the passgate 88 are both turned on and whatever logic signal appears at the D input 28 of the slave stage data latch 14 is coupled to the output line 100 through the passgate 88, and the inverters 96 and 98, and to the output line 36 through the passgate 88, and inverters 96 and 104. This data path enabled by the high level of clock line CK_S1 (and its complement) reduces the serial data chain path through the SEU immune flip-flop 10 from the SI input 64 of the master latch 12 to the SO output 48 of the slave latch 16 through the passgate 88, inverter 96 and inverter 98. This introduces little delay through a chain of these lip-flops and permits fast shifting of data through the flip-flop chain, allowing quick initial setting of all the master stages of SEU immune flip-flops 10 in the chain. When the slave stage data latch 14 is held in transparent mode, switched inverter 70 is disabled, since p-channel switch transistor 74 and n-channel switch transistor 82 are both switched off. If the slave latch clock line CK_S1 34 is held at a low logic level, the slave stage data latch 14 is in its latched mode.

Complete programming of SEU immune flip-flop 10 is done by latching the master stage data latch 12 into the desired state by setting CK 58 to a high logic level and setting CK_S1 34 to a high logic level, thus providing a low logic level at the clock input 18 of the master stage data latch 14 to latch its Q output 22, while the slave stage data latch 14 is held in transparent mode enabling the passgate 88 and turning off switch transistors 74 and 82 to disable the switched inverter 70. CK 58 must remain high for a length of time sufficient to overcome the RC delay of the slave stage data latch 14. Once the second stage latch 14 is in its final state, (i.e., after the RC delay caused by vertical resistor element 102 and the capacitance of the gates of the p-channel inverter transistor 72 and the n-channel inverter transistor 80), the slave latch clock line CK_S1 34 is set to a low logic level to turn on the switched inverter and place the slave stage data latch 14 in a regeneration mode that latches the state of the inverter 70 through the time delay regenerative feedback circuit, i.e. through a feedback loop from the output of the inverter 70, the inverter 96, back to the input of the inverter 70 through the RC network. The flip-flop circuit 10 is now SEU immune.

Persons of ordinary skill in the art will readily appreciate that the switched inverter 70 shown in FIG. 2 may be configured in a number of different ways. As non limiting examples, the positions of the switch transistors 74 and 82 and the inverter transistors 72 and 80 may be reversed, with the common drain connections of the inverter transistors connected to the output node 78 and the sources of the switch transistors 78 and 82 connected to the voltage supply nodes 76 and 84. Alternately, the switch transistors 78 and 82 may be eliminated and a passgate (and necessary inverter) can be inserted in series between the input node 86 and the output node 78 of the inverter 70. The passgate would be connected to the CK_S1 and CK_S1_B clock lines 34 and 94 such that it would be enabled when the passgate 88 is disabled and disabled when the passgate 88 is enabled.

Persons of ordinary skill in the art will appreciate that the signals on slave latch clock line CK_S1 34, and clock line CK_S1_B 94 need to be SEU immune clock signals. Providing SEU immune clock signals is well within the level of ordinary skill in the art.

The length of a SET pulse from which the SEU immune flip-flop 10 of the present invention is SEU immune depends on the resistance of the vertical resistor element 102 plus the gate capacitance of the inverter transistors 72 and 80. The vertical resistor element resistance 102 is preferably quite large, i.e, greater than about 1MΩ. This has several consequences. One is that the gate leakage of the inverter transistors 72 and 80 becomes critical because the rate of charge of the gate capacitance through the vertical resistor element 102 has to be larger than the rate of discharge of the gate capacitance caused by gate leakage. At vertical resistor resistance values below about 1 GΩ, it is possible that the gate leakage of core devices may allow them to be used. The designer will be easily able to make the choice depending on the particular technology, device geometry, and process used.

The core supply voltage will also affect the gate leakage. For example, in accordance with an aspect of the present invention, at a core supply voltage of 0.8V, a ratio of about at least 3:1 of charging current to leakage current will assure that the output of the inverter 70 will not erroneously switch. This ratio is core supply voltage dependent (i.e., a ratio of about at least 4:1 will be sufficient for a core supply voltage of 1V, and a ratio of about at least 5:1 will be sufficient for a core supply voltage of 1.2V) Where the gate leakage of core transistors in an integrated circuit is excessive, high voltage devices (a term commonly used in integrated circuit design to refer to I/O transistors in an integrated circuit that employ thicker gate oxides than transistors used in the core of the integrated circuit) can be advantageously used as the inverter transistors 72 and 80 to provide low gate leakage since their gate leakage is several orders of magnitude less than the gate leakage of core transistors having thinner gate oxides. Given the gate capacitance characteristics of the inverter transistors 72 and 80, the resistance value of the vertical resistor 102 can be chosen by selecting the geometry of the vertical resistor or providing more than one vertical resistor element connected in parallel.

Settling times of the SEU immune flip-flop 10 are relatively long, and depend on the value of the RC time constant determined by the resistance of the vertical resistor element used and the gate capacitances of the inverter transistors. This is the reason the SEU immune flip-flop 10 of the present invention is particularly useful for seldomly programmed flip-flops, such as those used to configure user-programmable circuits such as FPGAs.

Figure 3:
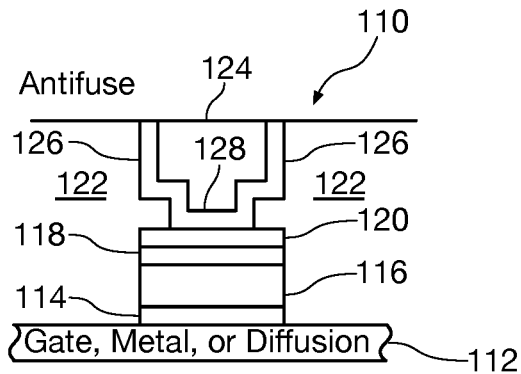
FIG. 3 is a cross-sectional view of a typical antifuse device structure that may be employed as a vertical resistor element in embodiments of the present invention.

Referring now to FIG. 3, a cross-sectional view shows a typical unprogrammed antifuse device structure 110 that may be employed as one form of a vertical resistor 102 in embodiments of the present invention. The unprogrammed antifuse 110 is formed over one of a transistor gate, metal interconnect layer, or diffusion in a substrate or well (shown as layer 112). Layer 114 is a lower electrode of the antifuse, layer 116 is a layer of antifuse material formed over the lower electrode 114 and which may be formed from a material such as doped or undoped amorphous silicon. An upper electrode 118 is formed over the antifuse material 116. The layers 114, 116, and 118 may then be etched as a stack. In some embodiments, layer 112 may be used as an etch stop layer and in other embodiments a separate etch-stop layer (not shown) may be formed over layer 112. In some embodiments, an additional diffusion barrier layer 120 for an upper layer of metal is also formed on and etched with the stack.

A dielectric layer 122 is then formed over the stack of layers 114, 116, and 118 and a metal layer is formed and connected to the top layer (120 or 118) of the stack. In FIG. 18, the metal layer is shown as a damascene copper layer 124 surrounded by a liner 126 as is known in the art. Prior to formation of the liner 126 and the copper metal line 124, a via 128 is formed to make connection to the top layer 118 or 120 of the antifuse as is known in the art.

Antifuse structures such as the one described above are well known. One non-limiting illustrative example of antifuse device structure 110 is shown in U.S. Pat. No. 5,770,885, the entire contents of which are incorporated herein by reference. The antifuse device structure 110 remains unprogrammed, and in this state has a resistance on the order of from about 1M ohm to greater than about 1 G ohm.

Figure 4:
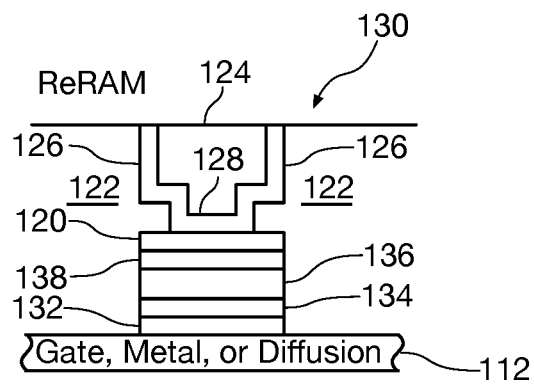
FIG. 4 is a cross-sectional view of a typical virgin ReRAM element structure that may be employed as a vertical resistor element in embodiments of the present invention.

Referring now to FIG. 4, a cross-sectional view shows a typical virgin ReRAM element structure 130 that may be employed as another form of a vertical resistor in embodiments of the present invention. A "virgin" ReRAM element 130, is identical in every way to a conventional ReRAM element except there is no way to program or erase it so it always remains in the fully erased state in which it was when fabricated. This is a high impedance state, where its resistance is field dependent but is greater than about 10MΩ and can exceed about 20 GΩ. This form of a vertical resistor 102 is very useful in that it provides an extremely high impedance while taking up almost no layout area on the integrated circuit because it can be fabricated on an existing contact or inter-metal via in the integrated circuit structure. The polarity of the ReRAM element 102 does not matter. One non-limiting example of a ReRAM element is described in U.S. Pat. No. 8,415,650 issued Apr. 9, 2013, the entire contents of which are incorporated herein by reference.

As shown in FIG. 4 to which attention is now directed, a ReRAM element is basically two metal plates separated by a solid electrolyte layer. The ReRAM element normally can be programmed by applying a voltage potential having a polarity that will drive metal ions from one of the metal plates into the solid electrolyte layer and erased by applying a voltage potential having a polarity that will drive the metal ions back to the source metal plate.

Some of the structure shown in the embodiment of FIG. 4 is similar to some of the structure depicted in FIG. 3. Accordingly, elements present in FIG. 4 that correspond to elements in FIG. 3 will be designated using the same reference numerals as used in FIG. 3.

An unprogrammed ("virgin") ReRAM element 130 is formed over one of a transistor gate, metal interconnect layer, or diffusion in a substrate or well (shown as layer 112). Layer 132 is a diffusion barrier and/or adhesion layer. Layer 134 is a lower electrode of the virgin ReRAM element 130. Layer 136 is a solid electrolyte layer formed over the lower electrode 134. An upper electrode 138 is formed over the solid electrolyte layer 136. In some embodiments, a diffusion barrier layer 120 is also formed on and etched with the stack. The layers 132, 134, 136, 138, and 120 (if present) may then be etched as a stack. In some embodiments, layer 112 may be used as an etch stop layer and in other embodiments a separate etch-stop layer (not shown) may be formed over layer 112.

As in the embodiment of FIG. 3, a dielectric layer 122 is then formed over the stack of layers 132, 134, 136, 138 and 120 and a metal layer is formed and connected to the top layer (120 or 138) of the stack. In FIG. 4, the metal layer is shown as a damascene copper layer 124 surrounded by a liner 126 as is known in the art. Prior to formation of the liner 126 and the copper metal line 124, a via 128 is formed to make connection to the top layer 138 or 120 of the virgin ReRAM element structure 130 as is known in the art.

Figure 5:
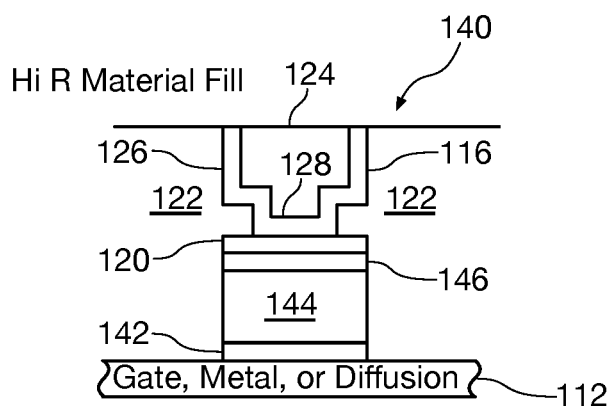
FIG. 5 is a cross-sectional view of another typical high-resistance structure that may be employed as a vertical resistor element in embodiments of the present invention.

Referring now to FIG. 5, a cross-sectional view shows another typical high-resistance structure 140 that may be employed as a vertical resistor in embodiments of the present invention. Some of the structure shown in the embodiment of FIG. 5 is similar to some of the structure depicted in FIG. 3 and FIG. 4. Accordingly, elements present in FIG. 5 that correspond to elements in the embodiments of FIG. 3 and FIG. 4 will be designated using the same reference numerals as used in those drawing figures.

A high-resistance structure 140 is formed over one of a transistor gate, metal interconnect layer, or diffusion in a substrate or well (shown as layer 112). Layer 142 is a diffusion barrier and/or adhesion layer. Layer 144 is layer of high-resistance material formed over layer 142. A second diffusion barrier layer 146 is formed over the layer of high-resistance material 144. In some embodiments, a second diffusion barrier layer 120 is also formed on and etched with the stack. The layers 142, 144, 146, and 120 (if present) may then be etched as a stack. In some embodiments, layer 112 may be used as an etch stop layer and in other embodiments a separate etch-stop layer (not shown) may be formed over layer 112.

As in the embodiment of FIG. 3 and FIG. 4, a dielectric layer 122 is then formed over the stack of layers 142, 144, 146, and 120 and a metal layer is formed and connected to the top layer (120 or 146) of the stack. In FIG. 5, the metal layer is shown as a damascene copper layer 124 surrounded by a liner 126 as is known in the art. Prior to formation of the liner 126 and the copper metal line 124, a via 128 is formed to make connection to the top layer 146 or 120 of the virgin ReRAM element as is known in the art.

Numerous materials may be employed to form the high-resistance layer 144. A non-exhaustive list includes silicon-rich $SiO_2$, tantalum-rich $Ta_2O_5$, titanium-rich $TiO_2$, aluminum-rich $Al_2O_3$, silicon-rich SiN. Such films can be formed using CVD, PECVD and other deposition processes. Other process-compatible stable high-resistance materials will readily suggest themselves to persons of ordinary skill in the art. The thicknesses and chemical compositions of these materials and the deposition conditions necessary to deposit them to produce desired values of resistance can be easily determined experimentally for employment in particular embodiments of the present invention. These design parameters are easily tailored by persons of ordinary skill in the art to achieve a resistance value of from about 1M ohm to greater than 1 G ohm.

Persons of ordinary skill in the art will appreciate that, while a damascene copper metallization structure 124 is shown in FIGS. 3-5, other types of metallization layers may be employed instead. Such skilled persons will readily understand how to integrate such other metallization schemes into the present invention.

Persons of ordinary skill in the art will appreciate that the drawing figures show the vertical resistors all oriented in the same polarity. Such skilled persons will appreciate that, since the devices will never be programmed, in any of the circuits disclosed herein the orientation of the ReRAM elements does not matter and they can be oriented in whatever manner best suits the layout and design.

One major advantage of the SEU immune flip-flop of the present invention is its size. The vertical resistor element is very small for the given resistance and allows simple gate capacitance to be used for the RC network.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A single event upset (SEU) immune flip-flop comprising:
   a clock line configured to supply a clock signal;
   a master stage data latch having a data input, a data output, and a clock input coupled to the clock line, the master stage data latch assuming a transparent state in response to a first state of the clock signal and a latched state in response to a second state of the clock signal;
   a slave stage data latch having a data input coupled to the data output of the master stage data latch, a data output, a scan output, and a slave latch clock input;
   a scan slave data latch having a data input coupled to the scan output of the slave stage data latch, a data output, and a clock input coupled to the clock line, the scan slave data latch assuming a transparent state in response to the second state of the clock signal and a latched state in response to the first state of the clock signal; and
   a slave latch clock line configured to supply a slave clock signal to the slave latch clock input of the slave stage data latch, the slave stage data latch having a transparent state in response to a first state of the slave clock signal and a latched state in response to a second state of the slave clock signal,
   wherein the slave stage data latch includes:
      a switched inverter having an input node and an output node, the switched inverter in a disabled state when the slave stage data latch is in the transparent state and in an enabled state when the slave stage data latch is in the latched state, the switched inverter formed from switch transistors and inverter transistors; and
      a time delay regenerative feedback circuit coupled between the input node of the switched inverter and the output node of the switched inverter, the time delay regenerative feedback circuit forming an RC network when the switched inverter is in its enabled state, the RC network providing a time delay longer than a time period of an SEU event.

2. The SEU immune flip-flop of claim 1 further comprising:
   a set signal line; and
   wherein the master stage data latch and the scan slave data latch each include a set input coupled to the set signal line.

3. The SEU immune flip-flop of claim 1 further comprising:
   a reset signal line; and
   wherein the master stage data latch and the scan slave data latch each include a reset input coupled to the reset signal line.

4. The SEU immune flip-flop of claim 1 further comprising:
   a multiplexer having a first data input coupled to a data signal line, a second data input coupled to a scan input signal line, a data output coupled to the data input of the master stage data latch, and a select input coupled to an input select signal.

5. The SEU immune flip-flop of claim 1 wherein the slave stage data latch has a data output coupled to the output node of the switched inverter.

6. The SEU immune flip-flop of claim 1 wherein the RC network includes a vertical resistive element and a capacitive element, the capacitive element comprising gate capacitances of the inverter transistors in the switched inverter, the vertical resistive element connected in series with the capacitive element.

7. The SEU immune flip-flop of claim 6 wherein the vertical resistive element is formed as an unprogrammed antifuse.

8. The SEU immune flip-flop of claim 6 wherein the vertical resistive element is formed as a virgin ReRAM device.

9. The SEU immune flip-flop of claim 6 wherein the vertical resistive element is formed as a layer of a high-resistance metal compound.

10. The SEU immune flip-flop of claim 9 wherein the high-resistance metal compound is one of silicon-rich $SiO_2$, tantalum-rich $Ta_2O_5$, titanium-rich $TiO_2$, aluminum-rich $Al_2O_3$, and silicon-rich SiN.

11. The SEU immune flip-flop of claim 1
wherein the switched inverter switch transistors and inverter transistors comprise:
a p-channel inverter transistor connected in series with a p-channel switching transistor between a first voltage supply node and the switched inverter output node, a gate of the p-channel inverter transistor connected to the switched inverter input node;
an n-channel inverter transistor connected in series with an n-channel switching transistor between the inverter output node and a second voltage supply node, a gate of the n-channel inverter transistor connected to the switched inverter input node, and
wherein the time delay regenerative feedback circuit comprises a first inverter whose input is connected to the switched inverter output node and whose output is connected in series with the RC network, the RC network including a vertical resistive element coupled to the switched inverter input node, the provided time delay being a function of a resistance of the vertical resistive element and a capacitor comprising the capacitances of the gates of the p-channel inverter transistor and the re-channel inverter transistor.

12. The SEU immune flip-flop of claim 11, further comprising a second inverter connected between an output of the first inverter and the scan output of the slave stage data latch.

13. The SEU immune flip-flop of claim 12, further comprising a third inverter connected between an output of the first inverter and an output node of the SEU immune flip-flop.

14. A single event upset (SEU) immune flip-flop comprising:
a clock line configured to supply a clock signal;
a master stage data latch having a data input, a data output, and a clock input coupled to the clock line, the master stage data latch assuming a transparent state in response to a first state of the clock signal and a latched state in response to a second state of the clock signal;
a slave stage data latch having a data input coupled to the data output of the master stage data latch, a data output, a scan output, and a slave latch clock input;
a scan slave data latch having a data input coupled to the scan output of the slave stage data latch, a data output, and a clock input coupled to the clock line, the scan slave data latch assuming a transparent state in response to the second state of the clock signal and a latched state in response to the first state of the clock signal; and
a slave latch clock line configured to supply a slave clock signal to the slave latch clock input of the slave stage data latch, the slave stage data latch having a transparent state in response to a first state of the slave clock signal and a latched state in response to a second state of the slave clock signal,
wherein the slave stage data latch includes:
a switched inverter having an input node and an output node, the switched inverter in a disabled state when the slave stage data latch is in the transparent state and in an enabled state when the slave stage data latch is in the latched state, the switched inverter formed from switch transistors and inverter transistors; and
a time delay regenerative feedback circuit coupled between the input node of the switched inverter and the output node of the switched inverter, the time delay regenerative feedback circuit including a vertical resistive element,
wherein the vertical resistive element forms an RC network when the switched inverter is in its enabled state, the RC network including a capacitive element connected in series with the vertical resistive element, the capacitive element comprising the gate capacitances of the inverter transistors.

* * * * *

UNITED STATES PATENT AND TRADEMARK OFFICE
CERTIFICATE OF CORRECTION

PATENT NO. : 10,819,318 B1
APPLICATION NO. : 16/595096
DATED : October 27, 2020
INVENTOR(S) : Barry Britton et al.

Page 1 of 1

It is certified that error appears in the above-identified patent and that said Letters Patent is hereby corrected as shown below:

In the Specification

Column 6, Line 12, replace "re-channel" with --n-channel--.

In the Claims

Column 11, Line 44, Claim 11, Line 23, replace "re-channel" with --n-channel--.

Signed and Sealed this
Second Day of February, 2021

Drew Hirshfeld
*Performing the Functions and Duties of the
Under Secretary of Commerce for Intellectual Property and
Director of the United States Patent and Trademark Office*